United States Patent
Wang

(12)
(10) Patent No.: US 6,621,125 B1
(45) Date of Patent: Sep. 16, 2003

(54) BURIED CHANNEL DEVICE STRUCTURE

(75) Inventor: Jeffrey Wang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/606,712

(22) Filed: Jun. 29, 2000

(30) Foreign Application Priority Data

May 11, 2000  (TW) ........................................ 89109006 A

(51) Int. Cl.⁷ .............................................. H01L 29/72
(52) U.S. Cl. ...................... 257/355; 257/369; 257/403; 257/407; 257/412; 257/616
(58) Field of Search ................................. 257/355, 369, 257/403, 407, 412, 616

(56) References Cited

U.S. PATENT DOCUMENTS

| | | | |
|---|---|---|---|
| 5,208,719 A | * | 5/1993 | Wei ............................ 257/358 |
| 5,742,555 A | * | 4/1998 | Marr et al. .................. 257/355 |
| 5,952,701 A | * | 9/1999 | Bulucea et al. ............. 257/407 |

* cited by examiner

Primary Examiner—Edward Wojciechowicz
(74) Attorney, Agent, or Firm—J.C. Patents

(57) ABSTRACT

A buried channel device structure for an electrostatic discharge protection circuit capable of minimizing the effect on the electrostatic discharge protection circuit due to current flowing close to gate oxide layer. A p+ ion-doped region is formed above a p-type substrate. The p+ ion-doped region serves as a gate terminal. A first and a second n+ ion-doped region are also formed in the p-type substrate on each side of the p+ gate terminal. In addition, an n-doped region is formed in the p-type substrate under the p+ gate terminal between the first and the second n+ ion-doped region. A similar buried channel device structure can also be formed on an n-type structure.

5 Claims, 5 Drawing Sheets

BURIED CHANNEL DEVICE STRUCTURE

CROSS-REFERENCE TO RELATED APPLICATION

This application claims the priority benefit of Taiwan application serial no. 89109006, filed May 11, 2000.

BACKGROUND OF THE INVENTION

1. Field of Invention

The present invention relates to a buried channel device structure. More particularly, the present invention relates to a buried channel device for strengthening the protective capacity of an electrostatic protection circuit.

2. Description of Related Art

Electrostatic discharge is one of the leading causes of damage to an integrated circuit (IC) such as dynamic random access memory (DRAM) and static random access memory (SRAM) during manufacturing and post-manufacture transportation. For example, a person walking on a carpet in an environment with a high relative humidity can generate several hundred to several thousand volts of static electricity. Under exceptionally dry conditions, a voltage of up to ten thousand volts is possible. When the charged body makes contact with a silicon chip, static electricity may discharge irreparably damage the chip. To reduce chip damage due to electrostatic discharge, hard-wired electrostatic discharge circuits are often provided. In other words, an on-chip electrostatic discharge protection circuit is formed between the internal circuit and each bonding pad.

As the gate terminal of a transistor is reduced due to miniaturization, the dual-doped gate has gradually replaced the single doped gate. FIG. 1A is a cross-sectional view of a conventional MOSFET having an n-surface channel. In FIG. 1A, the MOSFET includes a p-type substrate 10, a gate oxide layer 18, a gate terminal 12 above the gate oxide layer 18 and a pair of source/drain terminals 14 and 16 in the substrate 10. The gate terminal 12 and the source/drain terminals 14 and 16 are formed in two n+ ion implants. FIG. 1B is a cross-sectional view of a conventional MOSFET having a p-surface channel. Similarly, in FIG. 1B, the MOSFET includes an n-type substrate 20, a gate oxide layer 28, a gate terminal 22 above the gate oxide layer 28 and a pair of source/drain terminals 24 and 26 in the substrate 20. The gate terminal 22 and the source/drain terminals 24 and 26 are formed in two n+ ion implants. In both the n- and p-surface channel MOSFET, an electric current I will flow through the channel close to the gate oxide layer (18 or 28) when the MOSFET is in operation.

In general, a surface n-channel or p-channel can effectively improve the short channel effect and can operate with minimal power in CMOS transistor that has a low and symmetrical threshold voltage. However, when the surface channel MOSFET having a dual-doped gate is used in an electrostatic discharge protection circuit, protection capacity is compromised because the operating current flows too close to the gate oxide layer.

SUMMARY OF THE INVENTION

Accordingly, one object of the present invention is to provide a buried channel device for an electrostatic discharge protection circuit such that current flows through a path away from the gate oxide layer and maximizes electrostatic discharge protection.

To achieve these and other advantages and in accordance with the purpose of the invention, as embodied and broadly described herein, the invention provides a buried channel device structure for an electrostatic discharge protection circuit. The buried channel device structure includes a p-doped substrate, a p+ ion-doped region, a first n+ ion-doped region, a second n+ ion-doped region and an n-doped region. The p+ ion-doped region is formed above the p-doped substrate serving as a gate terminal. The first n+ ion-doped region is formed in the p-doped substrate on one side of the p+ ion-doped region serving as a source terminal. The second n+ ion-doped region is formed in the p-doped substrate on the other side of the p+ ion-doped region serving as a drain terminal. The n-doped region is formed under the p+ ion-doped region in the p-doped substrate between the first n+ ion-doped region and the second n+ ion-doped region. Due to the presence of an n-doped region under the p+ ion-doped gate terminal, current flows through a path away from the gate oxide layer. Hence, operation of the electrostatic discharge protection circuit is unaffected.

Similarly, a buried channel device in an n-doped substrate is able to re-direct current through a path away from the gate oxide layer. Hence, operation of the electrostatic discharge protection circuit is also unaffected. The buried channel device structure includes an n-doped substrate, an n+ ion-doped region, a first p+ ion-doped region, a second p+ ion-doped region and a p-doped region. The n+ ion-doped region is formed above the n-doped substrate serving as a gate terminal. The first p+ ion-doped region is formed in the n-doped substrate on one side of the n+ ion-doped region serving as a source terminal. The second p+ ion-doped region is formed in the n-doped substrate on the other side of the n+ ion-doped region serving as a drain terminal. The p-doped region is formed under the n+ ion-doped region in the n-doped substrate between the first p+ ion-doped region and the second p+ ion-doped region.

This invention also provides a method of forming a buried channel device in an electrostatic discharge protection circuit. A polysilicon gate layer is formed on the p-doped substrate of an electrostatic discharge protection circuit. An ion implant is carried out, implanting p+ ions into the polysilicon gate layer. The p+ ion-doped layer is partially etched to form a p+ gate terminal. An n+ ion implant is carried out, implanting n+ ions into the p-doped substrate and the p+ gate terminal. Concentration of the p+ ions is greater than concentration of the n+ ions. Consequently, a first n+ ion-doped region and a second n+ ion-doped region are formed in the p-doped substrate on each side of the p+ gate terminal and an n-doped region is formed in the p-doped substrate under the p+ gate terminal. The first and the second n+ ion-doped region become the source and drain terminal of the buried channel device.

Similarly, the method of forming an n-channel buried channel device in an electrostatic discharge protection circuit is also suitable for forming a p-channel buried channel device. A polysilicon gate layer is formed on the n-doped substrate of an electrostatic discharge protection circuit. An ion implant is carried out, implanting n+ ions into the polysilicon gate layer. The n+ ion-doped layer is partially etched to form an n+ gate terminal. A p+ ion implant is carried out, implanting p+ ions into the n-doped substrate and the n+ gate terminal. Concentration of the n+ ions is greater than concentration of the p+ ions. Consequently, a first p+ ion-doped region and a second p+ ion-doped region are formed in the n-doped substrate on each side of the n+ gate terminal and a p-doped region is formed in the n-doped substrate under the n+ gate terminal. The first and the second p+ ion-doped region become the source and drain terminal of the buried channel device.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
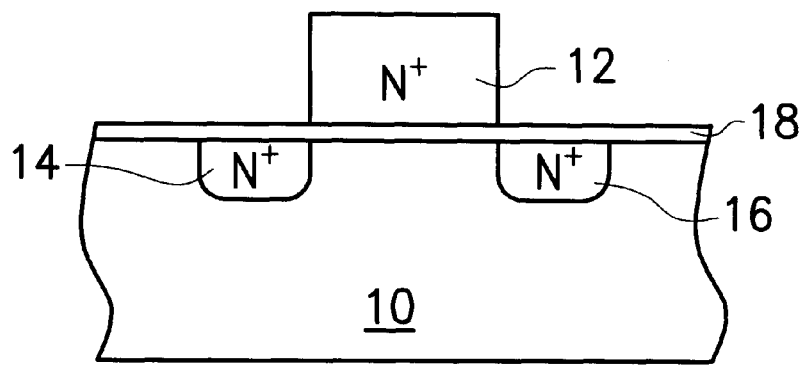
FIG. 1A is a cross-sectional view of a conventional MOSFET having an n-surface channel.
Figure 1B:
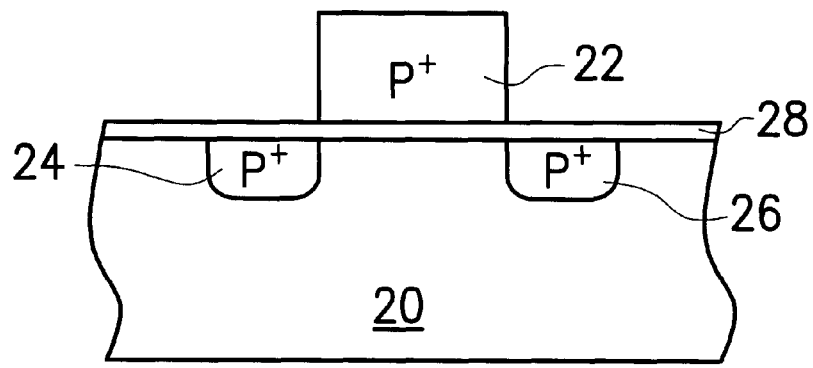
FIG. 1B is a cross-sectional view of a conventional MOSFET having a p- surface channel.

Reference will now be made in detail to the present preferred embodiments of the invention, examples of which are illustrated in the accompanying drawings. Wherever possible, the same reference numbers are used in the drawings and the description to refer to the same or like parts.

The present invention provides a structure of using buried channel devices in ESD protection circuit that is fabricated by dual-doped gate process. The capability of ESD protection circuit is significantly improved.

Figure 2A:
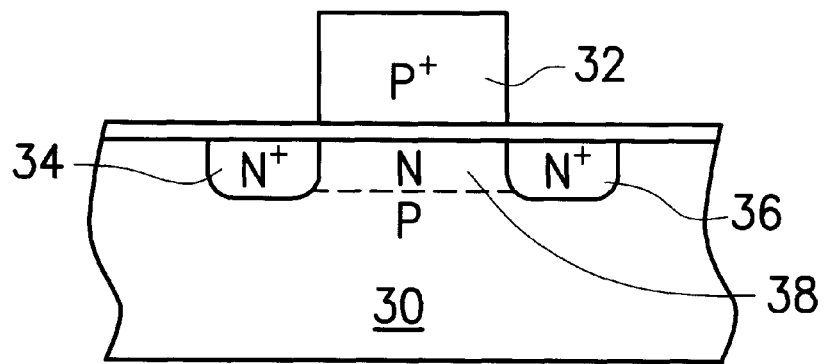
FIG. 2A is a cross-sectional view of an n-channel buried channel device structure according to one preferred embodiment of this invention.
Figure 2B:
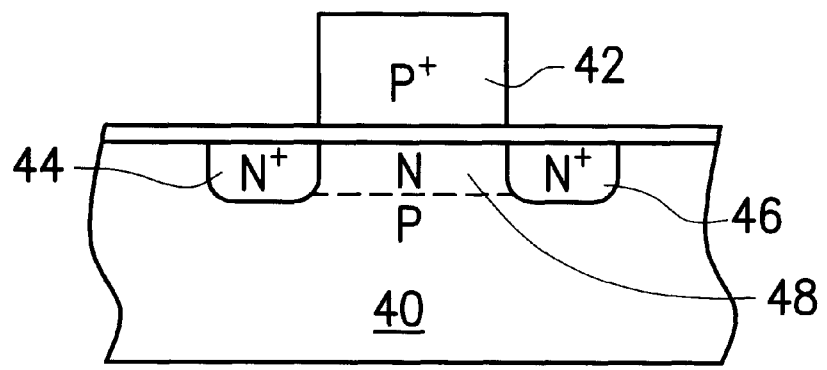
FIG. 2B is a cross-sectional view of a p-channel buried channel device structure according to one preferred embodiment of this invention.

FIG. 2A is a cross-sectional view of an n-channel buried channel device structure according to one preferred embodiment of this invention. FIG. 2B is a cross-sectional view of a p-channel buried channel device structure according to one preferred embodiment of this invention.

As shown in FIG. 2A, the n-channel buried channel device includes a p-type substrate 30, a p+ ion-doped region 32, a first n+ doped region 34, a second n+ ion-doped region 36 and an n-doped region 38. The p+ ion doped region 32 is formed above the p-type substrate 30 and serves as a gate terminal. The first n+ ion-doped region 34 is formed in the p-type substrate 30 on one side of the p+ ion-doped region 32 serving as a source terminal. The second n+ ion-doped region 36 is formed in the p-type substrate 30 on the other side of the p+ ion-doped region 32 serving as a drain terminal. The n-doped region 38 is formed in the p-type substrate 30 under the p+ ion-doped region 32 and between the first n+ ion-doped region 34 and the second n+ ion-doped region 36. The electrostatic discharge protection circuit is formed under the n-doped region 38. Hence, current will flow along a pathway away from the gate oxide layer, preventing any adverse effect on the operation of the electrostatic discharge protection circuit.

A p-channel buried channel device structure is shown in FIG. 2B. Similarly, current is directed away from the gate oxide layer, preventing any adverse effect from affecting the operation of the electrostatic discharge protection circuit. The p-channel buried channel device includes an n-type substrate 40, an n+ ion-doped region 42, a first p+ doped region 44, a second p+ ion-doped region 46 and a p-doped region 48. The n+ ion doped region 42 is formed above the n-type substrate 40 serving as a gate terminal. The first p+ ion-doped region 44 is formed in the n-type substrate 40 on one side of the n+ ion-doped region 42 serving as a source terminal. The second p+ ion-doped region 46 is formed in the n-type substrate 40 on the other side of the n+ ion-doped region 42 serving as a drain terminal. The p-doped region 48 is formed in the n-type substrate 40 under the n+ ion-doped region 42 between the first p+ ion-doped region 44 and the second p+ ion-doped region 46.

Figure 3A:
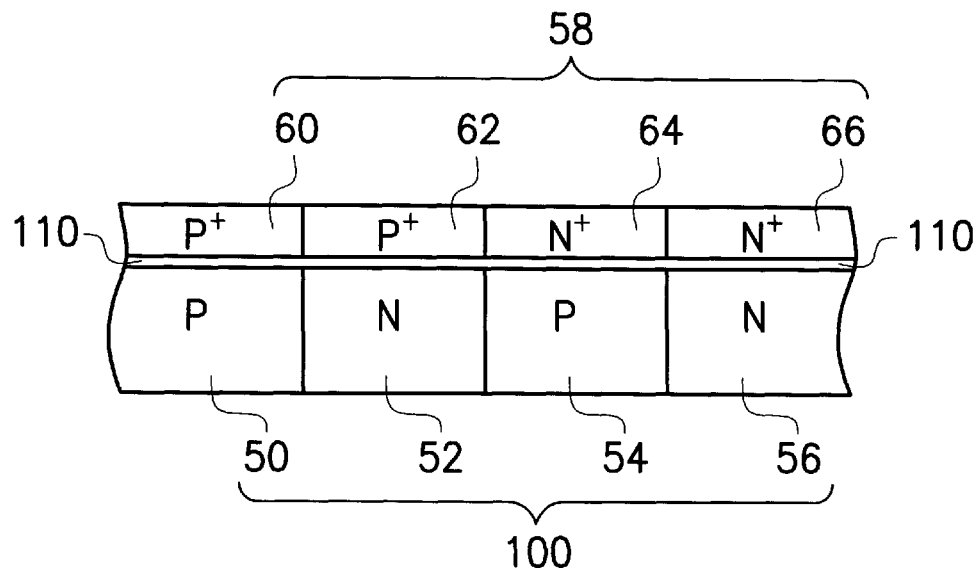
FIGS. 3A through 3C are cross-sectional views showing the progression of steps for forming a buried channel device in an electrostatic discharge protection circuit and a surface channel device in a main circuit according to this invention.
Figure 3B:
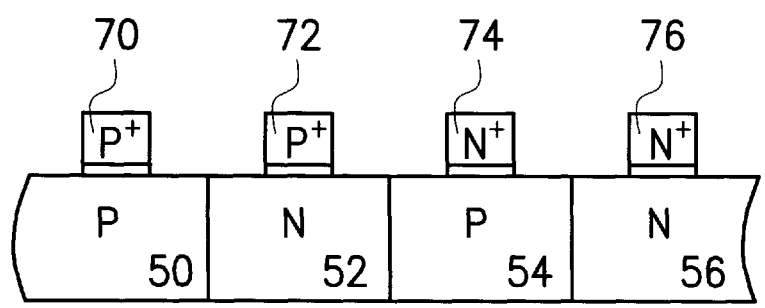
Figure 3C:
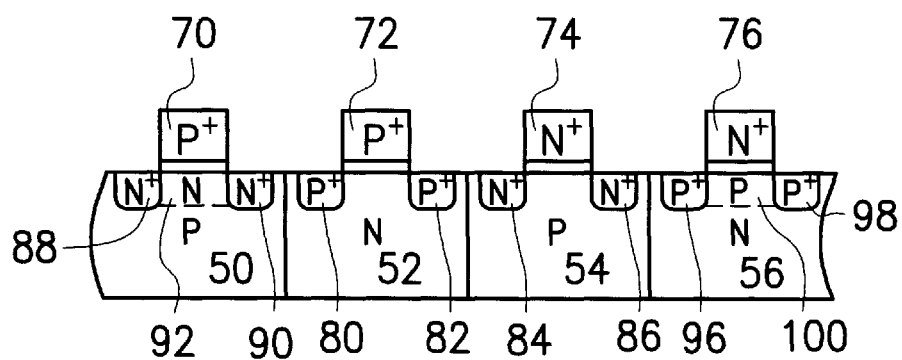

FIGS. 3A through 3C are cross-sectional views showing the progression of steps of a dual-doped gate process for forming a buried channel device in an electrostatic discharge protection circuit and a surface channel device in a main circuit according to this invention.

First, as shown in FIG. 3A, a substrate 100 with a oxide layer formed thereon is provided. A bottom portion of the substrate 100 is divided into a p-type substrate 50, an n-type substrate 52, a p-type substrate 54 and an n-type substrate 56. The n-type substrate 52 and the p-type substrate 54 in the middle are used to illustrate the formation of a surface channel device above the main circuit, whereas the p-type substrate 50 and the n-type substrate 56 on each side are used to illustrate the formation of a buried channel device above the electrostatic discharge protection circuit. A polysilicon layer 58 is formed over the p-type substrate 50, the n-type substrate 52, the p-type substrate 54 and the n-type substrate 56 of the substrate 100. N-type and p-type ion implants are carried out using different photomasks so that a p+ ion-doped region 60, a p+ ion-doped region 62, an n+ ion-doped region 64 and an n+ ion-doped region 66 are formed over the p-type substrate 50, the n-type substrate 52, the p-type substrate 54 and the n-type substrate 56, respectively. The p+ ion-doped region 60, the p+ ion-doped region 62, the n+ ion-doped region 64 and the n+ ion-doped region 66 are partially etched to form a p+ gate terminal 70, a p+ gate terminal 72, an n+ gate terminal 74 and an n+ gate terminal 76, respectively as shown in FIG. 3B.

With reference to FIG. 3C, a p-type ion implant is carried out, implanting p-type ions into the n-type substrate 52 to form a first p+ ion-doped region 80 and a second p+ ion-doped region 82 serving as a drain and a source terminal, respectively. Similarly, an n-type ion implant is carried out, implanting n-type ions into the p-type substrate 54 to form a first n+ ion-doped region 84 and a second n+ ion-doped region 86 serving as a drain and a source terminal, respectively. Hence, surface devices, one having an n-channel and one having a p-channel, are formed.

An n-type ion implant is carried out, implanting n-type ions into the p-type substrate 50. Since the original concentration of the p-type ions in the p+ gate terminal 70 is higher than the concentration of subsequently implanted n+ ions, the p+ gate terminal 70 is able to retain some p+ ion-doped properties. After the n-type ion implant, a first n+ ion-doped region 88 and a second n+ ion-doped region 90 are formed in the p-type substrate 50 on each side of the p+ gate terminal 70 and serve as a drain terminal and a source terminal, respectively. In addition, an n-type region 92 is formed in the p-type substrate 50 under the p+ gate terminal 70, thereby forming the buried n-channel of the buried channel device. Since the current pathway is now under the n-type region away from the gate oxide layer, operation of the electrostatic discharge protection circuit is unaffected.

Similarly, a p-type ion implant is carried out, implanting p-type ions into the n-type substrate 56. Since the original concentration of the n-type ions in the n+ gate terminal 76 is higher than the concentration of subsequently implanted p+ ions, the n+ gate terminal 76 is able to retain some n+ ion-doped properties. After the p-type ion implant, a first p+ ion-doped region 96 and a second p+ ion-doped region 98 are formed in the n-type substrate 56 on each side of the n+ gate terminal 76 serving as a drain terminal and a source terminal, respectively. In addition, a p-type region 100 is formed in the n-type substrate 56 under the n+ gate terminal 60, thereby forming the buried p-channel of the buried channel device. Since the current pathway is now under the p-type region away from the gate oxide layer, operation of the electrostatic discharge protection circuit is unaffected.

To form the aforementioned buried channel devices above the electrostatic discharge protection circuit and surface channel devices above the main circuit, suitable photomask must be used. FIGS. 4A through 4E show the photomasks for forming the buried channel device over an electrostatic discharge protection circuit fabricated by dual-doped gate process and the surface channel device over the main circuit according to this invention.

Figure 4A:
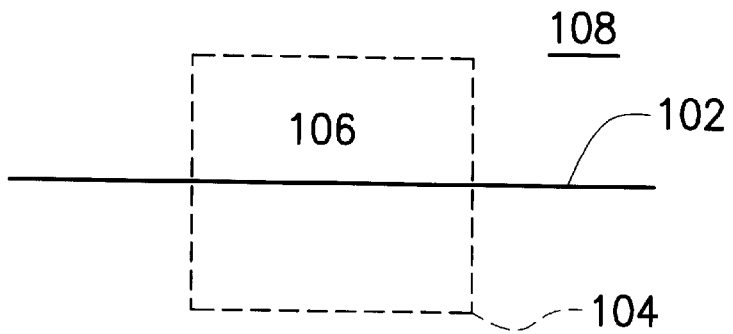
FIGS. 4A through 4E show the photomasks for forming a buried channel device over an electrostatic discharge protection circuit and a surface channel device over a main circuit according to this invention.

First, as shown in FIG. 4A, a solid line 102 is used to separate the circuit into a PMOS section (upper part) and an NMOS section (lower part). A dashed line 104 encloses a region 106 where the electrostatic discharge protection circuit is formed. The region 108 outside the dashed line 104 is used for forming the main circuit. Different photomasks are used to form the buried channel device over the electrostatic discharge protection circuit and the surface channel device over the main circuit as shown in FIGS. 4B to 4E.

Figure 4B:
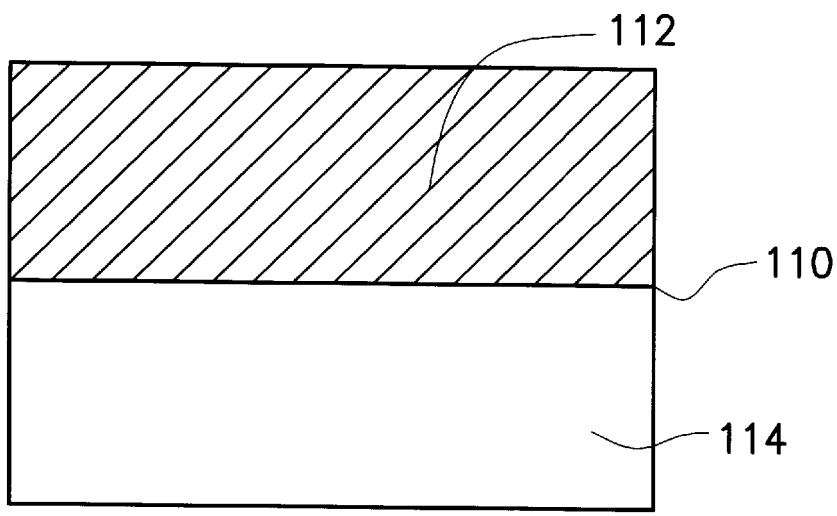

In FIG. 4B, the shaded upper portion 112 of the photomask 110 is a photoresist-covered region while the lower portion 114 is a transparent region. When an n-type ion implant is carried out, both the electrostatic discharge protection circuit and the main circuit portion in the NMOS section (the lower part) are doped. This corresponds to the formation as shown in FIG. 3A of n+ ion-doped region 64 and n+ ion-doped region 66 in the polysilicon layer above the p-type substrate 54 and the n-type substrate 56, respectively.

Figure 4C:
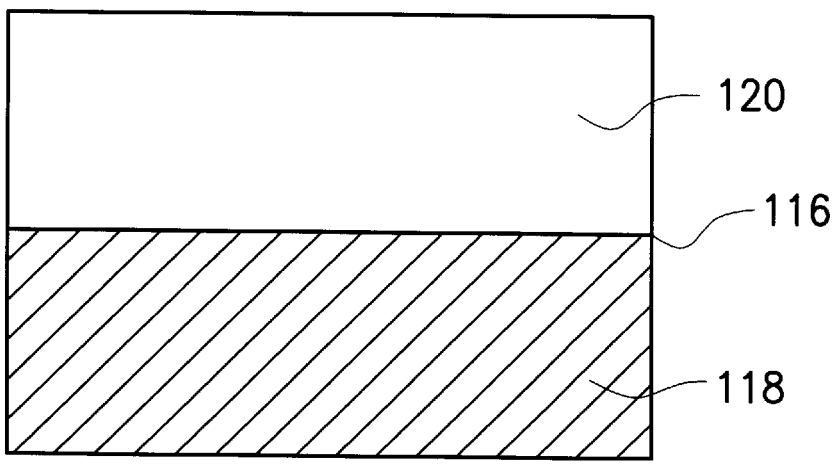

In FIG. 4C, the shaded lower portion 118 of the photomask 116 is a photoresist-covered region while the upper portion 120 is a transparent region. When a p-type ion implant is carried out, both the electrostatic discharge protection circuit and the main circuit portion in the PMOS section (the upper part) are doped. This corresponds to the formation as shown in FIG. 3A of p+ ion-doped region 60 and n+ ion-doped region 62 in the polysilicon layer above the p-type substrate 50 and the n-type substrate 52, respectively.

Figure 4D:
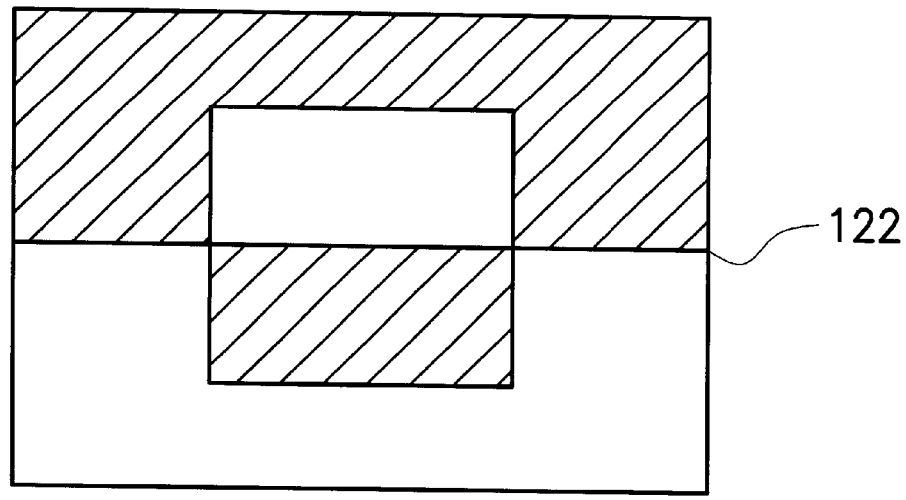

In FIG. 4D, the photomask 122 has a transparent region that corresponds to the electrostatic discharge protection circuit in the PMOS section and the main circuit in the NMOS section. Hence, the n+ ion-doped regions 88, 90 and n-type region 92 in the p-type substrate 50 and the n+ ion-doped regions 84 and 86 in the p-type substrate 54 are formed as shown in FIG. 3C after an n-type ion implant using the photomask 122.

Figure 4E:
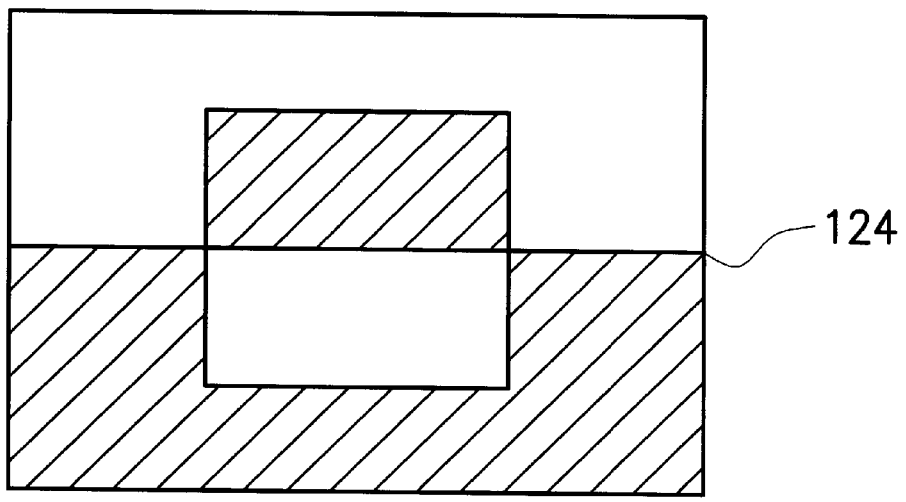

In FIG. 4E, the photomask 124 has a transparent region that corresponds to the electrostatic discharge protection circuit in the NMOS section and the main circuit in the PMOS section. Hence, the p+ ion-doped regions 80 and 82 in the n-type substrate 52 and the p+ ion-doped regions 96, 98 and p-type region 100 in the n-type substrate 56 are formed as shown in FIG. 3C after a p-type ion implant using the photomask 124.

In summary, the formation of an n-type or p-type buried channel under the gate oxide layer above an electrostatic discharge protection device is able to re-direct current flow away from the gate oxide layer. Hence, effectiveness of the electrostatic discharge protection circuit is maintained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
   a substrate having a main circuit region and an electrostatic discharge protection region;
   at least one surface channel device on the main circuit region; and
   at least one buried channel device on the electrostatic discharge protection region, wherein the buried channel device comprises an N-buried channel MOS transistor that comprises:
      a $P^+$ ion-doped gate terminal on the substrate,
      a first $N^+$ ion-doped region in the substrate on one side of the $N^+$ ion-doped gate terminal, wherein the first $N^+$ ion-doped region serves as a source terminal;
      a second $N^+$ ion-doped region in the substrate on another side of the $P^+$ ion-doped gate terminal, wherein the second $N^+$ ion-doped region serves as a drain terminal; and
      an N ion-doped buried channel under the $P^+$ ion-doped gate terminal.

2. The semiconductor device according to claim 1, wherein the surface channel device comprises an N-surface channel MOS transistor and the N-surface channel MOS transistor comprises:
   an $N^+$ ion-doped gate terminal on the substrate;
   a first $N^+$ ion-doped region in the substrate on one side of the $N^+$ ion-doped gate terminal, wherein the first $N^+$ ion-doped region serves as a source terminal; and
   a second $N^+$ ion-doped region in the substrate on another side of the $N^+$ ion-doped gate terminal, wherein the second $N^+$ ion-doped region serves as a drain terminal.

3. The semiconductor device according to claim 1, wherein the surface channel device comprises a P-surface channel MOS transistor and the P-surface channel MOS transistor, comprises:
   a $P^+$ ion-doped gate terminal on the substrate;
   a first $P^+$ ion-doped region in the substrate on one side of the $P^+$ ion-doped gate terminal, wherein the first $N^+$ ion-doped region serves as a source terminal; and
   a second $P^+$ ion-doped region in the substrate on another side of the $N^+$ ion-doped gate terminal, wherein the second $P^+$ ion-doped region serves as a drain terminal.

4. The semiconductor device according to claim 1, wherein the buried channel device further comprises a P buried channel MOS transistor that comprises:
   an $N^+$ ion-doped gate terminal on the substrate;
   a first $P^+$ ion-doped region in the substrate on one side of the $P^+$ ion-doped gate terminal, wherein the first $P^+$ ion-doped region serves as a source terminal;

a second P+ ion-doped region in the substrate on another side of the P+ ion-doped gate terminal, wherein the second P+ ion-doped region serves as a drain terminal; and a P ion-doped buried channel under the N+ ion-doped gate terminal.

5. The semiconductor device according to claim 1, wherein the surface channel device comprises an N-surface channel MOS transistor and a P-surface channel MOS transistor, and the N-surface channel MOS transistor comprises:

an N+ ion-doped gate terminal on the substrate;

a first N+ ion-doped region in the substrate on one side of the N+ ion-doped gate terminal, wherein the first N+ ion-doped region serves as a source terminal; and a second N+ ion-doped region in the substrate on another side of the N+ ion-doped gate terminal, wherein the second N+ ion-doped region serves as a drain terminal; and the P-surface channel MOS transistor comprises:

a P+ ion-doped gate terminal on the substrate;

a first P+ ion-doped region in the substrate on one side of the P+ ion-doped typed gate terminal, wherein the first P+ ion-doped region serves as a source terminal; and a second P+ ion-doped region in the substrate on another side of the p+ ion-doped gate terminal, wherein the second P+ ion-doped region serves as a drain terminal.

* * * * *